(12) United States Patent
Martin et al.

(10) Patent No.: US 6,630,693 B1
(45) Date of Patent: Oct. 7, 2003

(54) ELECTRO-OPTIC SEMICONDUCTOR DEVICES AND METHOD FOR MAKING THE SAME

(75) Inventors: Trevor Martin, Malvern (GB); Michael J Kane, Malvern (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/743,446

(22) PCT Filed: Jul. 15, 1999

(86) PCT No.: PCT/GB99/02285
§ 371 (c)(1),
(2), (4) Date: Jan. 10, 2001

(87) PCT Pub. No.: WO00/04616
PCT Pub. Date: Jan. 27, 2000

(30) Foreign Application Priority Data

Jul. 18, 1998 (GB) .............................................. 9815573

(51) Int. Cl.⁷ ............................................. H01L 29/277
(52) U.S. Cl. ............................. 257/98; 257/96; 438/31
(58) Field of Search .............................. 257/79, 94, 96, 257/97, 98; 385/14; 372/50; 438/24, 29, 31

(56) References Cited

U.S. PATENT DOCUMENTS 5,418,183 A  5/1995  Joyner et al.

FOREIGN PATENT DOCUMENTS

| EP | 0 472 221 | 2/1992 |
| EP | 0 703 476 | 3/1996 |
| JP | 7-193329 | * 7/1995 |

OTHER PUBLICATIONS

Patent Abstracts of Japan, vol. 17, Feb. 1993, "Integrated Type Semiconductor Laser Element".
Patent Abstracts of Japan, vol. 1995, No. 10, Nov. 1995, "Semiconductor Mode Blocking Laser".
H. Yamazaki et al, "Low Drive Voltage (1.5Vp.p.) and High Power DFB–LD/Modulator Integrated Light Sources Using Bandgap Energy Controlled selective MOVPE" *Electronics Letters*, vol. 32, No. 2, Jan. 1996, pp. 109–111.

* cited by examiner

Primary Examiner—Sara Crane
(74) Attorney, Agent, or Firm—Nixon & Vanderhye P.C.

(57) ABSTRACT

An electro-optic semiconductor device comprising a semiconductor waveguide with a core region within which is located at least one active area wherein the core of the waveguide outside of the one or more active areas are not contaminated by diffuse active area material and the one or more active area(s) and the waveguide are monolithic and are grown in an additive growth process. Also provided is a method of making an electro-optic semiconductor device, comprising the steps of; growing a first part of a core layer of a semiconductor waveguide, selectively growing an active layer over a partial area of the first part of the core layer, and growing a second part of the core layer of the semiconductor waveguide over the first part and the active layer, characterised in that the method comprises an additive growth process.

31 Claims, 3 Drawing Sheets

ELECTRO-OPTIC SEMICONDUCTOR DEVICES AND METHOD FOR MAKING THE SAME

BACKGROUND OF THE INVENTION

1. Field of the Invention

The present invention relates to electro-optic semiconductor devices which incorporate multiple active and passive component parts and methods for making the same. In particular the present invention relates to semiconductor lasers and detectors with integrated semiconductor waveguides and extended cavity semiconductor lasers and methods for making the same.

2. Discussion of Prior Art

Electro-optic semiconductor devices are used in the quickly developing field of high speed analogue and digital optical signal processing circuitry which have applications in high speed, wide-bandwidth optomicrowave and optical transmission techniques particularly in the field of telecommunications.

Electro-optic semiconductor components, such as semiconductor lasers and waveguides, are currently grown separately in different growth processes to generate different component structures on separate crystal substrates. Subsequently, the separate component structures are assembled into a single subsystem. There are significant losses at interfaces between the separate component structures which lead to high input power requirements. Also, problems of accurately optically aligning the separate component structures leads to high complexity and cost.

Alternatively, electro-optic semiconductor components, such as semiconductor lasers and waveguides are grown with quantum well layers, which extend over the whole area of crystal growth. Selected areas of these quantum well crystal growth layers are subsequently destroyed by the process of quantum well intermixing in which the selected parts of the quantum well layers are caused to diffuse into surrounding crystal growth layers. Unfortunately, the quantum well diffusion method only allows device to be grown within a passive waveguide. Also, the diffuse material can change the properties of the surrounding crystal growth layers, for example, passive waveguide core layers, in an undesirable manner. The diffusion process is significantly alloy dependent, ie. what works for a GaAlAs structure does not work for a InGaP structure. This places a constraint on the type of materials that can be used in the quantum well layers. Also, this method of crystal growth requires a post processing quantum well intermixing step to destroy the selected areas of the layers of quantum wells, which adds expense.

A further method of growing layers of quantum wells within a passive waveguide core is to grow the layers of quantum wells over the whole area of crystal growth and then stop the crystal growth and selectively etch away unwanted areas of the layers of quantum wells. After the etching process a passive waveguide layer is grown over the remaining areas of quantum well layers. The problem with this process is that the growth process has to be interrupted to perform at least one etching process. This adds complexity and cost to the growth process and can reduce yield.

A method and device are described in U.S. Pat. No. 5,418,183 in which the device is made using selective area epitaxy in which a mask is deposited on the partly grown device and the mask is defined by an etching process. This is followed by further epitaxial growth in the areas exposed by the mask and then by removal of the mask by etching. The structure and thus the resulting characteristics of the epitaxial growth in the areas exposed by the mask are critically dependent on the dimensions of the deposited mask. Also, the removal of the partly grown structure from the epitaxial growth chamber for the two etching stages and the processes involved in the etching stages can introduce contamination into the resulting device. Accordingly, the method described is relatively complex and can have associated low yields.

SUMMARY OF THE INVENTION

The present invention aims to overcome at least some of the above mentioned problems by providing electo-optic semiconductor devices which are cheap, have low losses and so reduced power requirements and are robust.

Therefore, according to the present invention there is provided an electro-optic semiconductor device comprising a semiconductor waveguide with a core region within which is located at least one active area wherein the core of the waveguide outside of the active area is not contaminated with diffuse active area material and the active area and waveguide are monolithic and are grown in an additive growth process.

Also, according to the present invention, there is provided an electro-optic semiconductor device comprising a semiconductor waveguide with a core region within which is located at least one active area wherein the profile of the core region follows the profile of the active area, and the active area and waveguide are monolithic and are grown in an additive crystal growth process.

The electro-optic semi-conductor device according to the present invention is monolithic and so is a structure composed of a single continuous crystalline mass of material.

The term additive growth process is used to define a growth process in which a monolithic crystal structure is grown without any intermediate stages in which material is removed from the crystal previously grown. For example, it excludes growth processes which have an intermediate etching stage. Clearly, an additive growth process will generally be simpler and so will provide a cheaper way of making a monolithic crystal substrate comprising an active area located within a passive waveguide region.

The present invention combines this advantage with the advantage that no post processing stage is require to destroy selected parts of the active areas. Also, as the resulting device is monolithic there are very low coupling losses between the active area and the waveguide.

In post processing steps the active areas are configured as electro-optic components, such as lasers and detectors. Integration of at least one active area in the core of a waveguide enables optical connection between a plurality of electro-optical components, configured from the active areas, within a single crystal structure. Subsequent device configuration uses conventional and established processing technology to configure the active areas into electro-optic components. This monolithic integration will allow repeatable and reliable fabrication on a single substrate with low cost if high volumes are achieved. The resultant devices are simple, compact and robust because the entire device is a single crystalline structure. Optical alignment of, for example, a laser/waveguide interface requires no mechanical alignment, and so good optical alignment is achieved cheaply and without adding complexity.

Preferably the active area is located between two adjacent growth layers of the core of the waveguide. The growth method for this structure is very simple and enables multiple active areas to be grown in a single epitaxial growth which does not require multistage processing or regrowth.

An active area preferably comprises at least one quantum well layer or thin bulk layer having a smaller bandgap than the core of the waveguide. The parts of the resulting single crystal structure outside an active area become the passive optical interconnections defined by the waveguide whereas the regions with quantum wells become, for example, active laser or detector devices on subsequent processing. This is because the waveguide, having a wider bandgap is transparent to the light generated or detected by the active area.

It is preferable that the bandgap in an active area is less than the bandgap in a transition region between that active area and the core of the waveguide. This reduces losses due to band gap absorption outside of the active area.

The quantum well layers may be configured to act as a laser by post growth processing in which a laser stripe and an electrode are added. Alternatively, the quantum well layers may be configured to act as a detector by virtue of their absorption of light when they are reverse biased.

Preferably, the waveguide and active areas are grown using chemical beam epitaxy (CBE). CBE allows a simple mechanical shadow mask to expose well defined areas over which active areas can be grown. This is because the method of CBE allows a shadow mask to be selected of a material with which the CBE chemicals will not react strongly and so crystal deposits over the shadow mask are reduced. This combined with the area definition achievable in a molecular beam process such as CBE and the fact that CBE is a UHV (ultra high vacuum) technique enables a mechanical shadow mask technique to give good edge definition to active areas.

Alternative epitaxy methods which are suitable are Molecular Beam Epitaxy (MBE) and Metal Organic Vapour Phase Epitaxy MOVPE.

The waveguide and active area may comprise a III–V semiconductor composition which may be Indium Phosphide based which can form the basis for active electo-optical components operating at wavelengths, typically of, 1.3 and 1.5 microns.

Alternatively, the waveguide and active area may comprise a III–IV semiconductor composition which may be InAs, GaSb, or InSb based for electro-optic components operating at wavelengths from 1 micron to greater than 8 microns or GaAs based operating at visible to UV wavelengths.

In one embodiment according to the present invention the III–V semiconductor composition is Gallium Arsenide based which can form the basis for active electro-optic and optical components operating at wavelengths of 860 nm. These short operating wavelengths result in compact components, such as lasers and detectors, which are generally stable as a function of temperature, are more efficient and exhibit low noise. Furthermore, GaAs based processing technology is relatively advanced compared to other III–V semiconductor devices.

Where a GaAs based III–V semiconductor device working a 860 nm is required the waveguide can comprise Aluminium Gallium Arsenide and the active area can contain at least one layer of Gallium Arsenide and the core of the waveguide comprises typically 20% to 40% Aluminium and upper and lower cladding layers of the waveguide can contain typically 40% to 80% Aluminium. Furthmore, one of the cladding layers may be n-type doped and the other of the cladding layer may be p-type doped.

Preferably, a layer of GaAs which is at much thinner than a GaAs layer in the active area is located in the core of the waveguide beyond the active area and in a common plane with the active area. This prevents lengthy exposure of an AlGaAs substrate layer during crystal growth as is explained further below.

The device according to the present invention may be an extended cavity laser comprising at least one quantum well layer located within a core of a waveguide. The extent of the laser cavity may be defined by the natural cleavage planes of the monolithic crystal from which the device is formed.

The device according to the present invention may have a plurality of active areas within the core region. This enables a plurality of electro-optical devices to be integrated in a single monolithic crystalline substrate.

According to a second aspect of the present invention there is provided a method of making an electro-optic semiconductor device, comprising the steps of;

growing a first part of a core layer of a semiconductor waveguide, selectively growing at least one active layer over a partial area of the first part of the core layer, and growing a second part of the core layer of the semiconductor waveguide over the first part and the active layer, wherein the method comprises an additive crystal growth process.

The selective growth of an active layer may conveniently comprise the steps of;

selectively covering a portion of the first part of the core layer to expose a partial area of the first part of the core layer, growing at least one active layer on the exposed partial area, and uncovering the first part of the core layer.

The method according to the present invention enables the creation and integration of optical and electro-optic semiconductor devices (active and passive) on a single semiconductor wafer. Monolithic and planar integration of optical semiconductor devices is enabled on smaller lateral scales with less processing than previously possible by integration of active region in a waveguide layer at growth stage. Also, the need for etching and regrowth is removed. Performance and robustness are thus improved and cost, size, power requirement and weight reduced.

Waveguide cladding layers may be grown above and below the core layer and the active layer may comprise at least one quantum well layer having a smaller bandgap than the core of the waveguide.

As discussed above it is preferred that at least the core layer and active layer are grown using chemical beam epitaxy (CBE).

In a GaAs based semiconductor device with a layered structure described above, in order to reduce impurities in the growth crystal and so improve the optical characteristics of the resulting active and passive components, the growth is preferably conducted at a temperature of 400 to 700° C.

The first part of the core of the waveguide is preferably selectively covered by a mechanical shadow mask which may be made of silicon coated with silicon oxide, silicon dioxide or silicon nitride in order to reduce the amount of crystal growth on the mask surface. To accurately define the edges of the active layer it is preferred that the edges of the shadow mask defining an aperture which exposes an area of the first part of the core of the waveguide are tapered so that the edges adjacent to the area of the first part of the core of the waveguide form the thin end of the taper.

The method according to the present invention may be used to selectively grow a plurality of active layers over different partial areas of the first part of the core layer. This enables a plurality of active electro-optical devices, such as lasers and detectors to be integrated in a single monolithic crystalline substrate.

BRIEF DESCRIPTION OF THE DRAWINGS

The present invention will now be described with reference to the accompanying drawings in which.

DETAILED DISCUSSION OF EMBODIMENTS

Figure 1:
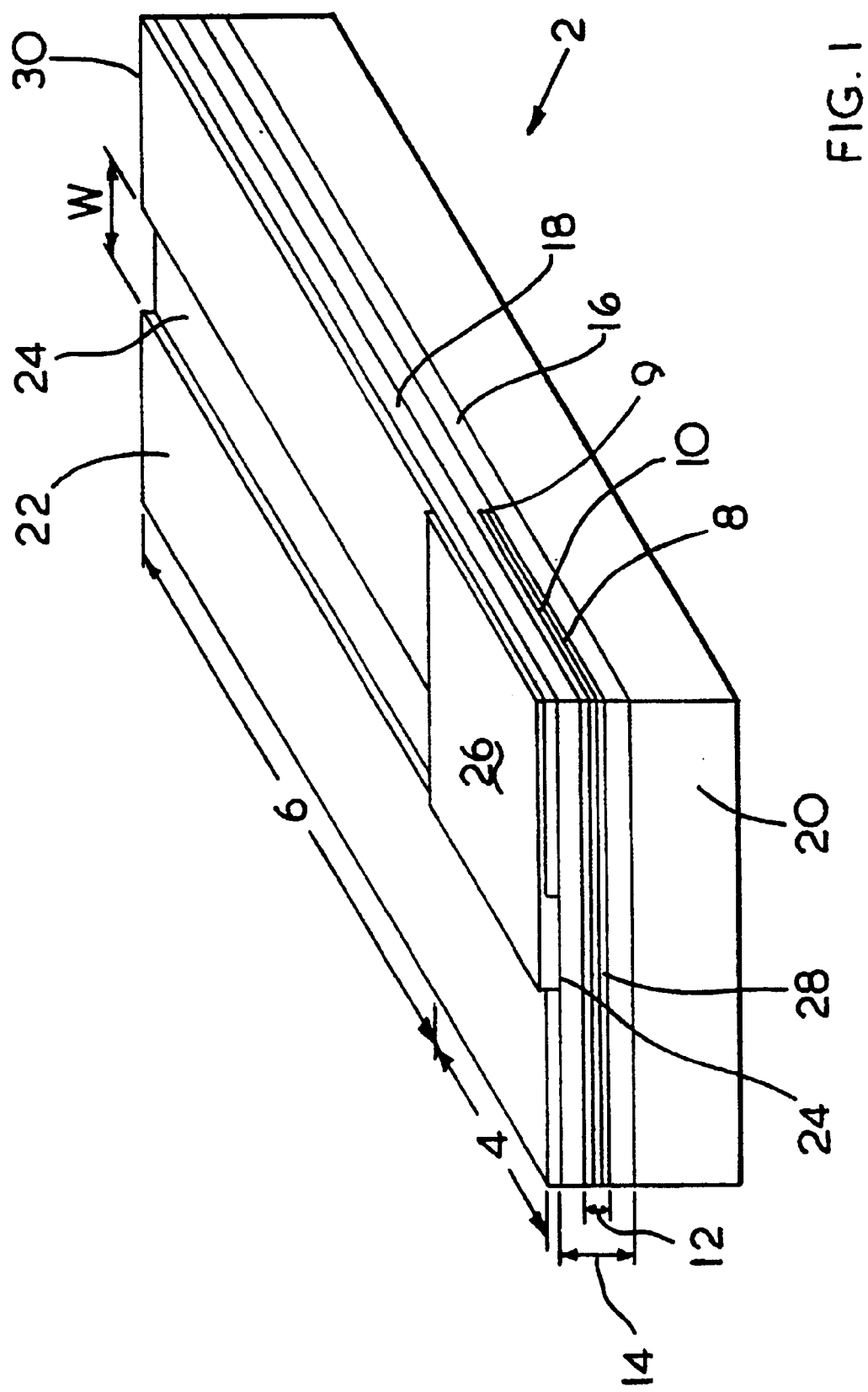
FIG. 1 shows a monolithic extended cavity laser according to the present invention.

Referring first to FIG. 1, there is shown a monolithic extended cavity laser (2) comprising an active laser region (4) and a passive waveguide region (6). The active laser region (4) is formed by the selective growth of a two quantum well layers (8,10) in a core (12) of a waveguide (14). The two quantum well layers (8,10) form the narrow bandgap semiconductor material required for lasing action.

The quantum well layers (8,10) are each formed from a 100 A (100 Angstrom) thick layer of Gallium Arsenide (GaAs). The quantum well layers are grown within a layer of undoped Aluminium Gallium Arsenide (AlGaAs) comprising 20% Aluminium. The layer of 20% AlGaAs forms the core (12) of a waveguide (14) which extends through the active laser region (4) and passive waveguide region (6) of the extended cavity laser (2). The lower boundary or cladding layer (16) of the waveguide (14) is formed from a layer of n-type doped AlGaAs comprising 40% Aluminium which has a higher refractive index than the 20% AlGaAs which forms the core (12) of the waveguide. The upper boundary or cladding layer (18) of the waveguide (14) is formed from a layer of p-type doped AlGaAs again comprising 40% Aluminium. The active and passive regions (4,6) are grown on an n-doped substrate of GaAs (20).

The post growth processing steps used to produce the extended cavity laser (2) are the same as those required for conventional oxide stripe semiconductor lasers (without an integral extended cavity). This eliminates additional complexity and disruption to standard processes, thereby ensuring a good yield. On top of the upper boundary layer (18) of the waveguide structure is deposited, during post growth processing, a layer of dielectric insulator (22), for example, Silicon Dioxide (SiO$_2$), Silicon Nitride (SiN) or a combination of both into which is opened the laser and waveguide stripe (24) which defines the extended cavity laser (2). The stripe can, for example, have a width (w) ranging from 25 microns to 75 microns. The opening of the waveguide stripe is only required for convenience, it is not essential for device operation. The opening above the laser stripe is required in order to get a metal contact (26) down onto the waveguide layer.

Over the whole length of the active laser region (4), on top of the dielectric insulator (22) and within the stripe (24), is deposited the metal contact (26) with which current is supplied to the regions of the quantum well layers (8,10) which lie directly below the stripe (24). Stimulated emission occurs at these quantum well layers which lie below the stripe (24) when current is pumped into the laser (2) via electrical contact (26), and the substrate (20).

Figure 2:
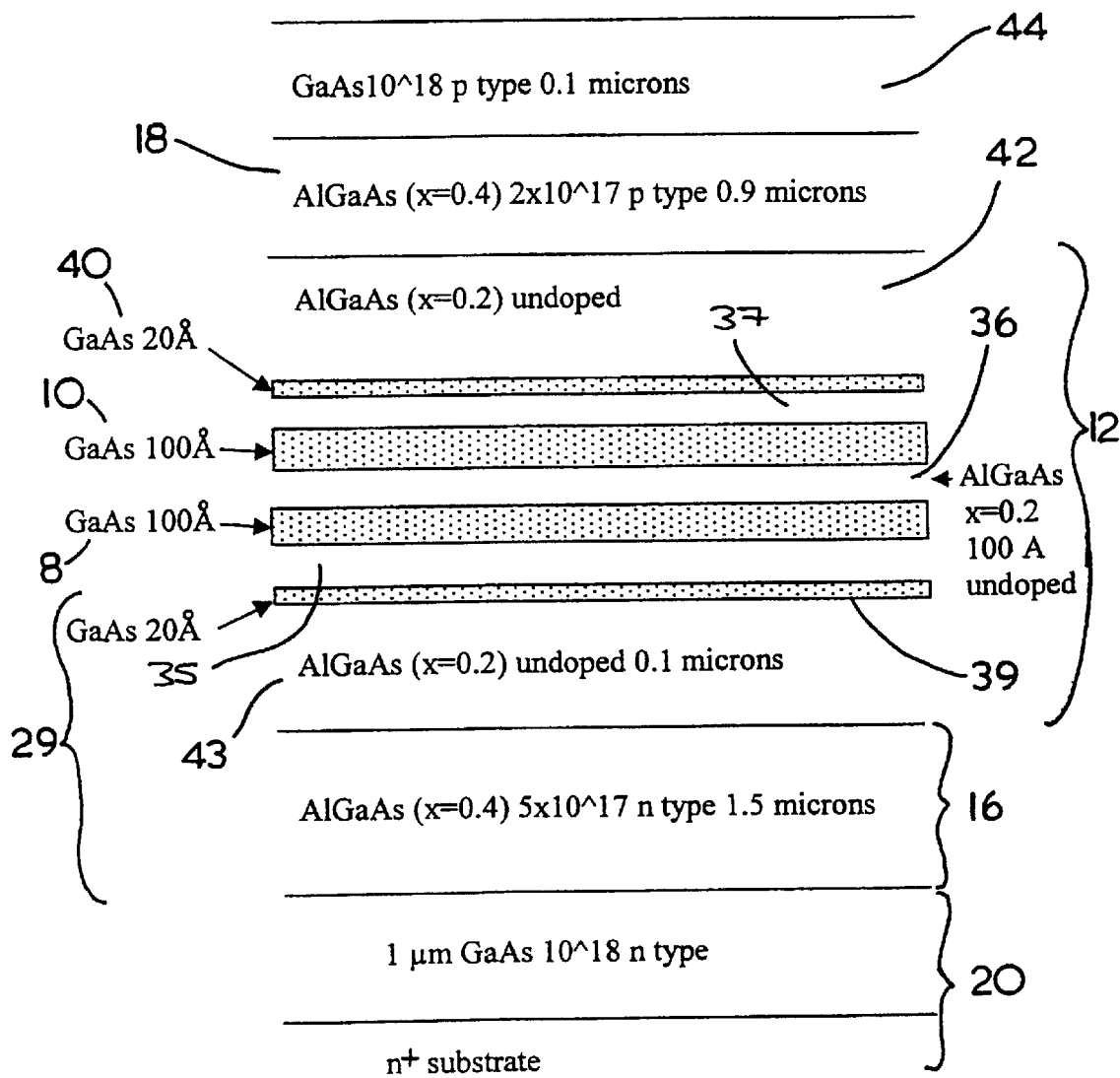
FIG. 2 shows the layered structure of the active portion of the extended cavity laser of FIG. 1.
Figure 3A:
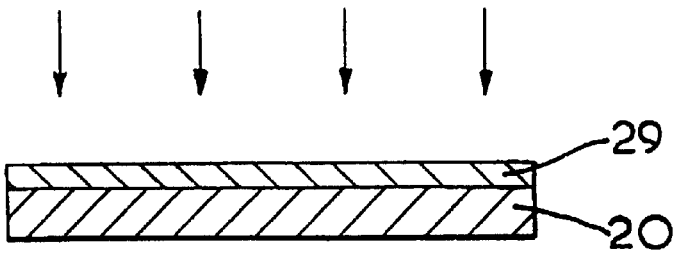
FIGS. 3a to 3c show a schematic representation of the method according to the present invention used to make the extended cavity laser of FIG. 1.
Figure 3B:
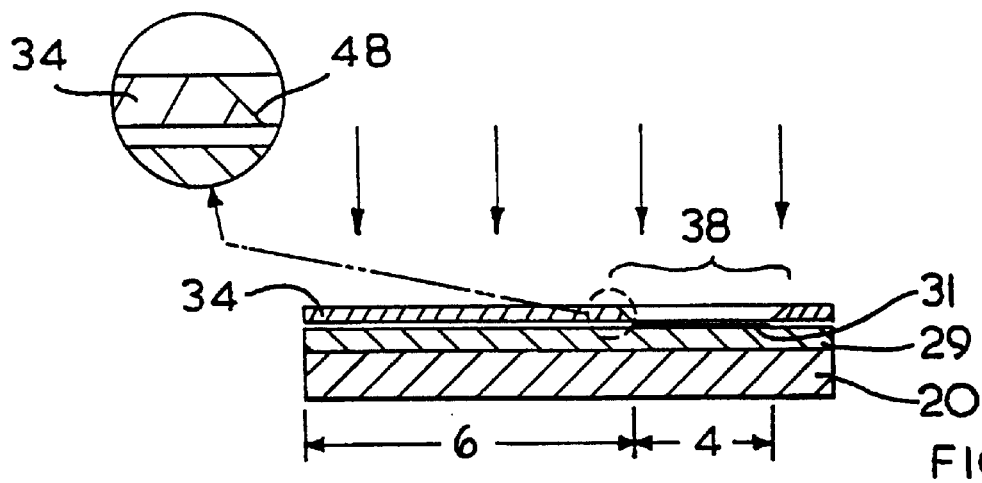
Figure 3C:
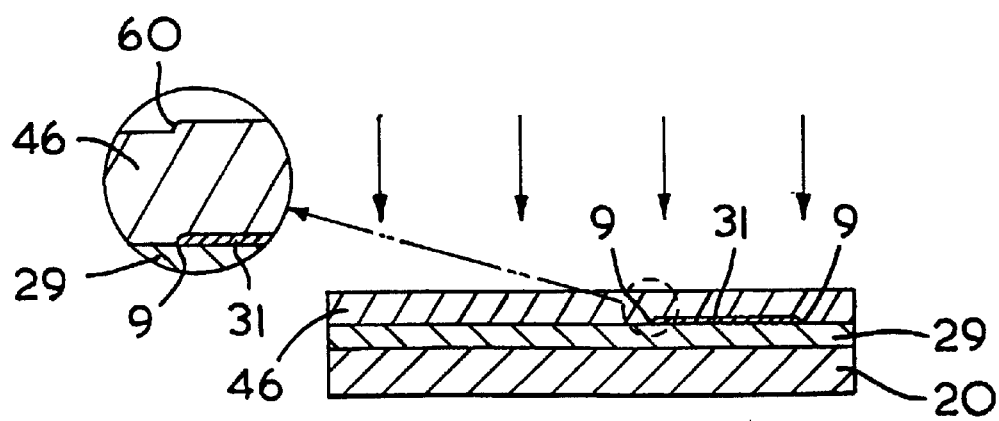

The structure of the active laser region (4) of the extended cavity laser (2) of FIG. 1 is shown in more detail in FIG. 2. FIGS. 3a to 3c show schematically, the method steps used to form the waveguide and quantum well layers of the extended cavity laser (2) of FIG. 1. Referring to these two Figures, a 1.5 micron layer of n-type doped 40% AlGaAs (16) is grown by chemical beam epitaxy (CBE) on an n-type doped substrate (20). Then a 1000 A thick layer of undoped 20% AlGaAs (43) is grown, followed by half of a 20 A thick undoped GaAs layer (39). In FIG. 3 the layer (29) comprises the 40% AlGaAs layer (16) and the 20% AlGaAs layer (43) and the half of the layer (39). Thereafter, a shadow mask (34) made from Silicon coated with SiO is located over the passive region (6) of waveguide layer (29) (see FIG. 3b) so that the active region (4) is exposed and the reminder of the layer (39) is grown. A 100 A layer of undoped 20% AlGaAs (35) is selectively grown in the area (38) of the crystal structure exposed by the shadow mask (34), followed by a 100 A thick GaAs layer, which forms the first quantum well layer (8). Then a second 100 A thick layer (36) of undoped 20% AlGaAs is selectively grown over the exposed area (38) of the crystal structure, followed by a second 100 A thick GaAs layer, which forms the second quantum well layer (10). A third 100 A thick layer of undoped 20% AlGaAs (37) is selectively grown over the exposed area (38) of the crystal structure and finally a 10 A thick layer of GaAs (first part of layer (40)), is selectively grown over the exposed area (38) of the crystal structure. The layers (35,8,36,10,37) are labelled together as (31) in FIGS. 3b and 3c. The shadow mask (34) is then removed and a 10 A thick GaAs layer (second part of layer (40)), a 1000 A thick undoped 20% AlGaAs layer (42), a 0.9 micron thick p-type doped 40% AlGaAs layer (18) and a 0.1 micron thick p-type doped GaAs layer (44) are grown sequentially over the entire area of the crystal structure. Layers (42,18,44) are labelled together as (46) in FIG. 3c.

The laser cavity of the extended cavity laser (2) is defined by cleaved facets (28,30), which are then cleaned and mirror coated. In accordance with convention, one facet (30) will be coated with a partially transmissive mirror coating to allow coupling of the laser light out of the device (2). Where cleaved facets are used, the optical waveguide defining the laser (ie. the region under the stripe (24)) has to be aligned to the crystallographic axis of the monolithic crystal structure of the laser (2). It is also a requirement that the edges (9) of the quantum well layers (8,10) are perpendicular to the axis of the stripe (24) and so the rotational alignment between the shadow mask (34) and the crystal planes of the monolithic crystal structure of the laser (2) has to be accurately controlled to enable the mirrors of the laser (2) to be defined by the natural cleavage planes of the crystalline semiconductor. Alternatively, ion etched facets can be used for the mirrors, thus eliminating the requirement of alignment of stripe (24) and edges (9) relative to the crystal structure. The length of the laser cavity can, for example, be between 300 microns and 1200 microns. Laser structures were processed and cleaved into a series of devices with a width of 75 82 m and varying cavity lengths of 300, 500, 700, 900 and 1200 µm.

Growth was carried out on a CBE reactor as described in a report by T. Martin and C. R. Whitehouse published in J. Crystal Growth 164 (1990) 57. Epitaxial films were deposited on 2 inch semi-insulating and ndoped GaAs wafers (20) which were loaded into the reactor. The native oxide was thermally removed from the surface of the wafer (20) before growth commenced. Triethylgallium (TEGa) (although tri-isopropyl gallium (TIPGa) could be used as an alternative) and Ethyldimethylamine Alane (EDMAAI) were used as the group III precursors while arsine ($AsH_3$) which was thermally cracked (EPI Gas Injector Cell EPI-Ta-GS-L) at 1150° was the group V source. GaAs and AlGaAs epilayers were doped n-type using Hydrogen Sulphide ($H_2S$) and p-type using Carbon Tetrabromide ($CBr_4$). Growth rates were calibrated with RHEED (Reflection High energy Electron Diffraction) oscillations and the growth temperature was calibrated before each run by using RHEED to monitor the surface reconstruction transition from As-stabilised to Ga-stabilised at a fixed As over-pressure. The typical growth temperature was 540° C. as measured using infrared pyrometry (Ircon Series V, wavelength range 0.91–0.97 $\mu$m). A temperature of 540° C. has been identified as the near ideal growth temperature to minimise the unintentional incorporation of oxygen and carbon in CBE growth.

The GaAs wafer (20) was mounted in a indium-free holder in which the GaAs wafer (20) sits proud of the holder to allow intimate contact between the growth substrate and the shadow mask. Crystalographic alignment was achieved by locating the major flat of the wafer (20) against a flat in the holder. The mounting of the wafer holder and the shadow mask were designed so that the rotational alignment between them was comparable to the tolerance commercial wafer suppliers quote for the alignment between the major flat and the crystalographic axis (better than ±0.5°).

The CBE growth must be stopped in order to insert the shadow mask (34) in front of the growth substrate. A bare surface of AlGaAs may be prone to an unacceptable degree of contamination if left exposed while fitting the mask. Therefore, the additional 10 A thick half layer of GaAs (39) is grown over the whole area of the substrate, before the shadow mask is applied. Also, after the growth of the 100 A layers (8,10), the growth is terminated with a 10 A half layer of GaAs (40) and the growth mask removed, The remaining AlGaAs layers are then grown after a 10 A GaAs growth restart layer (remaining half of layer (40). The resulting 20 A thick GaAs layers have a wider effective bandgap than that of the 100 A thick quantum well layers (8,10) so that the 20 A GaAs layers will not cause absorption losses at the bandgap of the quantum well layers.

During shadow masked growth by CBE, the shadow mask is stored, inserted and removed completely in vacuo, ie. it is not exposed to air. Air exposure of the growth surface and/or complicated ex-vacuo processing is thus totally avoided.

The above growth sequence generates what is essentially a planar structure with the active narrow bandgap laser region (4) being only approximately 50 nm higher than the passive wide bandgap waveguide region (6). The growth process ensures that a smooth gradation occurs between the regions, of the order of 100 times longer than the 50 nm or so height difference (See enlarged portion of FIG. 3c). This smooth gradation gives rise to a gradual increase in average bandgap from the laser region (4) to the waveguide region (6). This ensures that the interface between the regions is transparent to radiation at the 860 nm wavelength of the laser (2) and so absorption losses are low. Laser devices having a structure as shown in FIGS. 1 and 2 will, for example, have a threshold current of around 500 $Acm^{-2}$ when the cavity length is 500 microns The shadow mask (34) is made using a suitable dielectric, which is selected so that CBE growth occurs selectively on the exposed GaAs or AlGaAs surface and not on the exposed surface of the mask (34). This ensures that there is little or no crystal growth from the exposed surface (38) across the edges (48) of the shadow mask (34). If growth occurs from the exposed surface across the edge of the shadow mask then, when the mask is removed the crystal growth across the edge is broken, leaving a ragged edge. Therefore, a silicon shadow mask coated with silicon oxide, silicon nitride or a silicon dioxide is preferred. To achieve good edge definition in the selective growth process requires the edges (48) of apertures in the shadow mask (34) to be thin, ie. of the order of microns thick. This ensures that the epitaxial growth process is not dominated by a vertical wall of the mask which is more than 100 times higher than an epitaxial layer. Therefore, the shadow mask (34) is formed from Silicon wafer (typically around 450 microns thick) and the thin edges are achieved by the use of a 5% tetramethyl ammonium hydroxide (TMAH) etch. This etches preferentially the <111> planes and produces a 54.7° taper at the mask edge (shown in the enlarged part of FIG. 3b). Other etches, however, may be used The edges of the silicon mask (34) should be tapered as shown at (48) in the enlargement in FIG. 3b. This ensures that the edges of the quantum well layers are sufficiently abrupt so that they can be detected visually in the post processing steps, for example, to allow mask alignment for deposit of the electrode (26) so that there are no regions of quantum wells underneath the stripe (24) which are unpumped, ie. which extend beyond the edge of the electrode (26). Regions of unpumped wells underneath the stripe (24) will degrade the efficiency of the device (2) by optical absorption.

The laser (2) operates at a narrow bandwidth centred on ~860 nm. Although, the laser (2) is described above using a GaAs based III–V semiconductor device, alternatively, it could be made using an Indium Phosphide (InP) based III–V semi-conductor device which could operate at wavelengths of the order of 1.3 or 1.5 microns. Alternatively, the waveguide and active area may comprise a III–IV semiconductor composition which may be InAs, GaSb, or InSb based for electro-optic components operating at wavelengths from 1 micron to greater than 8 microns or GaN based operating at visible to UV wavelengths.

As can be seen from the enlarged portion of FIG. 3c the upper layer of the passive waveguide (46) follows the profile of the quantum well region (31). This is because the crystal layers making up the waveguide layer (46) are grown over the quatum well region. Above the edges of the quantum well region (eg. above the edge (9) in the enlarged portion of FIG. 3c) the upper surface of the passive waveguide layer has a step (60) in it where it follows the profile of the edge of the quantum well region.

Figure 4:
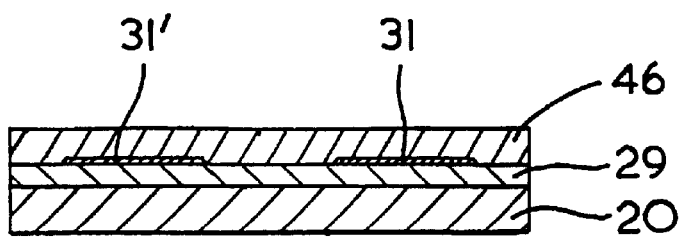
FIG. 4 shows a cross-sectional view of a waveguide according to the present invention within which are grown two active areas.

While the above description relates to the construction of a semiconductor electro-optic device with one active area, the same processes and can be used in the fabrication of devices wherein a plurality of different active areas are grown on a single substrate, as shown in FIG. 4. FIG. 4, shows a similar cross section to that shown in FIG. 3c, but with two active areas (31) and (31'). The monolithic crystal structure shown in FIG. 4 comprises a substrate (20), a lower layer of passive waveguide (29) including the waveguide cladding layer, an upper layer of passive waveguide (46) including the waveguide cladding layer and two quantum well regions (31) and (31'). The two quantum well regions could be of different bandgap material and could have different dimensions. They may be grown simultaneously onto the same substrate (29) through a single shadow mask with two apertures, in the case where the regions (31) and (31') are made from the same material. Alternatively, the regions (31) and (31') may be grown sequentially through different shadow masks with apertures in different positions. This enables a plurality of electro-optical devices to be integrated in a single monolithic crystalline substrate.

What is claimed is:

1. An electro-optic semiconductor device comprising:
a semiconductor waveguide;
a core region located within said waveguide; and
at least one active area located within the core region, said at least one active area is formed by selective deposition of active area material on only an active area portion of said core region and preventing deposition of said active area material on any remaining portion of said core region, wherein the waveguide and the core region outside of said at least one active area are not contaminated by said diffuse active area material.

2. A device according to claim 1 wherein the at least one active area is located between two adjacent growth layers of the core of the waveguide.

3. A device according to claim 1 wherein said at least one active area comprises at least one quantum well layer or bulk layer having a smaller bandgap than the core of the waveguide.

4. A device according to claim 1 wherein the bandgap in said at least one active area is less than the bandgap in a transition region between said at least one active area and the core of the waveguide.

5. A device according to claim 3 wherein the quantum well layers are configured to act as a laser.

6. A device according to claim 3 wherein the quantum well layers are configured to act as a detector.

7. A device according to claim 1 wherein the waveguide and said at least one active area is grown using chemical beam epitaxy.

8. A device according to claim 1 wherein the waveguide and said at least one active area comprises a III–V semiconductor composition.

9. A device according to claim 8 wherein the III–V semiconductor composition is Indium Phosphide based.

10. A device according to claim 8 wherein the III–V semiconductor composition is Gallium Arsenide based.

11. A device according to claim 10 wherein the waveguide comprises Aluminium Gallium Arsenide and said at least one area comprises at least one layer of Gallium Arsenide.

12. A device according to claim 10 wherein the core of the waveguide contains 20% to 40% Aluminium and upper and lower cladding layers of the waveguide contain 40% to 80% Aluminium.

13. A device according to claim 12 wherein the one of the cladding layers is n-type doped and the other of the cladding layer is p-type doped.

14. A device according to claim 1 wherein the device is an extended cavity laser comprising at least one quantum well layer located within a core of a waveguide and the extent of the laser cavity is defined by the natural cleavage planes of the monolithic crystal from which the device is formed.

15. A device according to claim 1 in which there are a plurality of active areas.

16. A method of making an electro-optic semiconductor device according to claim 1, comprising the steps of:
growing a first part of a core layer of a semiconductor waveguide,
selectively depositing at least one active layer only over an active area portion of the first part of the core layer, and
growing a second part of the core layer of the semiconductor waveguide over the first part and the at least one active layer,
wherein the method comprises an additive growth process without any intermediate steps in which material is removed.

17. A method according to claim 16 wherein the selective growth of said at least one active layer comprises the steps of;
selectively covering a portion of the first part of the core layer and exposing a partial area of the first part of the core layer,
growing said at least one active layer on the exposed partial area, and
uncovering the first part of the core layer.

18. A method according to claim 16 wherein waveguide cladding layers are grown above and below the core layer.

19. A method according to claim 16 wherein said at least one active layer comprises at least one quantum well layer or bulk layer having a smaller bandgap than the core of the waveguide.

20. A method according to claim 16 wherein the core layer and said at least one active layer are grown using chemical beam epitaxy.

21. A method according to claim 16 wherein the core layer and said at least one active layer comprise III–V semiconductor compositions.

22. A method according to claim 21 wherein the III–V semiconductor composition is Indium Phosphide based.

23. A method according to claim 21 wherein the III–V semiconductor composition is Gallium Arsenide based.

24. A method according to claim 23 wherein the waveguide comprises Aluminium Gallium Arsenide and the at least one active layer comprises at least one layer of Gallium Arsenide.

25. A method according to claim 24 wherein the core) of the waveguide contains 20% to 40% Aluminium and upper and lower cladding layers of the waveguide contain 40% to 80% Aluminium.

26. A method according to claim 25 wherein one of the cladding layers is n-type doped and the other of the cladding layers is p-type doped.

27. A method according to claim 17 wherein the first part of the core of the waveguide is selectively covered by a mechanical shadow mask.

28. A method according to claim 27 wherein the shadow mask is made of silicon coated with silicon oxide, silicon nitride or silicon dioxide.

29. A method according to claim 27 wherein edges of the shadow mask defining an aperture which exposes an area of the first part of the core of the waveguide are tapered so that the edges adjacent to the area of the first part of the core of the waveguide form the thin end of the taper.

30. A method according to claim 16 wherein said at least one active layer comprises a plurality of active layers, and said active layers are grown over different partial areas of the first part of the core layer.

31. A device which is grown using a method according to claim 16.

* * * * *